United States Patent
Heyder et al.

(12) 
(10) Patent No.: US 6,348,073 B1
(45) Date of Patent: Feb. 19, 2002

(54) APPARATUS AND METHOD FOR POSITIONING AN OBJECT AT MULTIPLE POSITIONS WITHIN AN ENCLOSURE

(75) Inventors: Roger Heyder, Los Altos; Thomas Brezoczky, San Jose; Deepak Manoharlal, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/569,738

(22) Filed: May 11, 2000

Related U.S. Application Data

(63) Continuation of application No. 08/882,567, filed on Jun. 25, 1997, now Pat. No. 6,106,582.

(51) Int. Cl.[7] .......................... H01L 21/00; H01L 21/64; H01L 49/07
(52) U.S. Cl. ...................................... 29/25.01
(58) Field of Search ................. 414/936, 938, 414/939, 940, 941; 29/25.01

(56) References Cited

U.S. PATENT DOCUMENTS

| | | | |
|---|---|---|---|
| 4,664,578 A | 5/1987 | Kakehi | 414/217 |
| 5,148,714 A | 9/1992 | McDiarmid | 118/730 |
| 5,674,039 A | 10/1997 | Walker et al. | 414/222 |
| 5,697,750 A | 12/1997 | Fishkin et al. | 414/217 |
| 5,833,426 A | 11/1998 | Marohl | 414/217 |

*Primary Examiner*—David E. Graybill
(74) *Attorney, Agent, or Firm*—Moser, Patterson & Sheridan, LLP

(57) ABSTRACT

An apparatus for positioning an object at multiple positions within an enclosure has a moveable positioning member attached to a linear motor, both of which are positioned within the enclosure. The moveable positioning member is adapted to receive and support the object. A control signal directs the motion of the linear motor which moves the moveable positioning member and, thus, the object. An insulated conductor extends through the wall of the enclosure and allows electrical communication through the enclosure wall. The insulated conductor communicates with a power supply and a control mechanism exterior the enclosure. A flexible connection line, adapted to avoid contact with the enclosure, provides communication between an insulated conductor and the linear motor so that the linear motor is in communication with the power supply and the control mechanism.

18 Claims, 5 Drawing Sheets

APPARATUS AND METHOD FOR POSITIONING AN OBJECT AT MULTIPLE POSITIONS WITHIN AN ENCLOSURE

This is a continuation of application (s) Ser. No. 08/882,567 filed on Jun. 25, 1997, U.S. Pat. No. 6,106,582.

BACKGROUND OF THE INVENTION

1. Field of the Invention

The present invention relates to the processing of integrated circuit wafers and equipment useful for such processing. More particularly, the invention relates to processes and equipment for indexing of a cassette in a vacuum environment. The invention uses a motion actuator fully disposed within the vacuum enclosure to eliminate the large vacuum to atmosphere interface found in prior art devices.

2. Background of the Related Art

In the processing of semiconductor wafers, the processes are often carried out in a vacuum to reduce the particulate level to which the wafers are exposed. The introduction of the wafers into the vacuum processing system must be made at atmospheric pressure. The system must then be pumped down to the desired vacuum. Therefore, each time wafers are introduced into the system, the system must go through a pumpdown cycle creating a throughput "hit," or delay, during which time the system must sit idle. Each throughput hit reduces the efficiency of the system and the manufacturing process.

Due to the importance of throughput efficiency, as many wafers as possible are introduced into the system during each pumpdown cycle. This is accomplished by placing the wafers in a cassette that holds the wafers in a horizontally oriented, vertically offset arrangement. The cassette is then placed on a receiving tray in a loadlock which is subsequently sealed and pumped down to the desired vacuum.

Vacuum processing systems, however, typically operate in a single horizontal plane. Robots within the system move the wafers horizontally through the system and position the wafers in a series of processing stations in which a series of process steps are carried out.

Consequently, the wafers vertically disposed within the cassette must be sequentially indexed to the horizontal operating plane so that the robot can access the indexed wafer and move it through the system. Accordingly, the loadlock must contain an indexing apparatus to adjust the vertical position of the cassette and align each of the wafers within the cassette with the horizontal operating plane.

In typical prior art devices, an example of which is shown in FIG. 1, the indexing apparatus uses a support shaft attached to the bottom of the receiving tray supporting the wafer cassette. The support shaft extends through the bottom of the vacuum enclosure thereby requiring a seal to enable the enclosure to be pumped to a desired vacuum level. A motion actuator positioned external to the loadlock moves the support shaft vertically in response to a control signal and, thereby, indexes the wafer cassette. The prior art motion actuator used for indexing wafer cassettes use either a lead screw or hydraulic offset mechanism.

In these prior art devices, a collapsible bellows extends between the receiving tray and the bottom of the loadlock to provide a vacuum to atmosphere seal where the support shaft penetrates the loadlock wall. The collapsible bellows expands and contracts as the receiving tray moves up and down to maintain the seal. However, this vacuum to atmosphere interface is a source for leaks which result in system inefficiency and downtime.

Additionally, the lead screw or hydraulic offset mechanisms of the prior art are relatively imprecise which lessens the cassette placement accuracy and the repeatability of the mechanism. Also, these lead screw or hydraulic offset mechanisms extend outside the walls of the loadlock and, therefore, require additional space, a precious commodity in manufacturing clean rooms.

SUMMARY OF THE INVENTION

In view of the foregoing, it is an object of the invention to provide an apparatus for indexing, or positioning, the wafer cassette and for eliminating the vacuum to atmosphere interface of the prior art. It is another object of the invention to provide an apparatus that has improved repeatability and wafer cassette placement accuracy than prior art devices that use a lead screw or hydraulic offset mechanism. Yet another object of the invention is to provide a more compact loadlock and motion actuator construction. Still a further object of the invention is to provide a more efficient system that has less down time. Other objects of the invention will become apparent from time to time throughout the specification and claims as hereinafter related.

In accordance with the invention, an apparatus is provided to eliminate the large vacuum to atmosphere interface by positioning a motion actuator completely within the enclosure. An object that is to be moved within the enclosure is placed upon a moveable positioning member which is positioned within the enclosure and is attached to the motion actuator. The motion actuator is adapted to move the moveable positioning member.

In the preferred embodiment, the apparatus is configured as a loadlock apparatus that is capable of maintaining a vacuum. Accordingly, the object is a wafer cassette adapted to removeably support a plurality of wafers in horizontal orientation, vertically offset from one another. The moveable positioning member has a platform with a flat upper surface adapted to receive the object thereon.

Additionally, to facilitate placement of the motion actuator in the enclosure, the motion actuator is preferably a linear motor that has a stator and a reaction plate. The use of the linear motor reduces the size requirements for the enclosure by eliminating the bulky shaft arrangement and provides for more accurate positioning of the cassette with greater repeatability. Its placement within the enclosure eliminates the large vacuum to atmosphere interface and, thereby, eliminates leaks at the interface. The stator is attached to the wall of the enclosure and the platform is attached to the reaction plate which is moveable relative to the stator. An insulated conductor extends through a wall of the enclosure defining a sealed interface therebetween. A flexible communication line, adapted to avoid contact with the enclosure, provides communication between the insulated conductor and the motion actuator.

BRIEF DESCRIPTON OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments. These and other objects and advantages of the invention will be apparent when read in conjunction with the accompanying drawings wherein.

DETAILED DESCRIPTION OF THE PREFERRED EMBODIMENT

A preferred embodiment will be described below with reference to a loadlock apparatus, or chamber, in which wafers are introduced into a vacuum processing systems. However, the invention is not limited to this precise form of apparatus for it may apply to any number of enclosure types including process chambers. In addition, the following description refers to a system in which wafers are processed horizontally such as in an ENDURA® platform manufactured by Applied Materials, Inc. of Santa Clara, Calif. The invention may be applied to other platforms in which the wafers are processed in a vertical plane.

Figure 1:
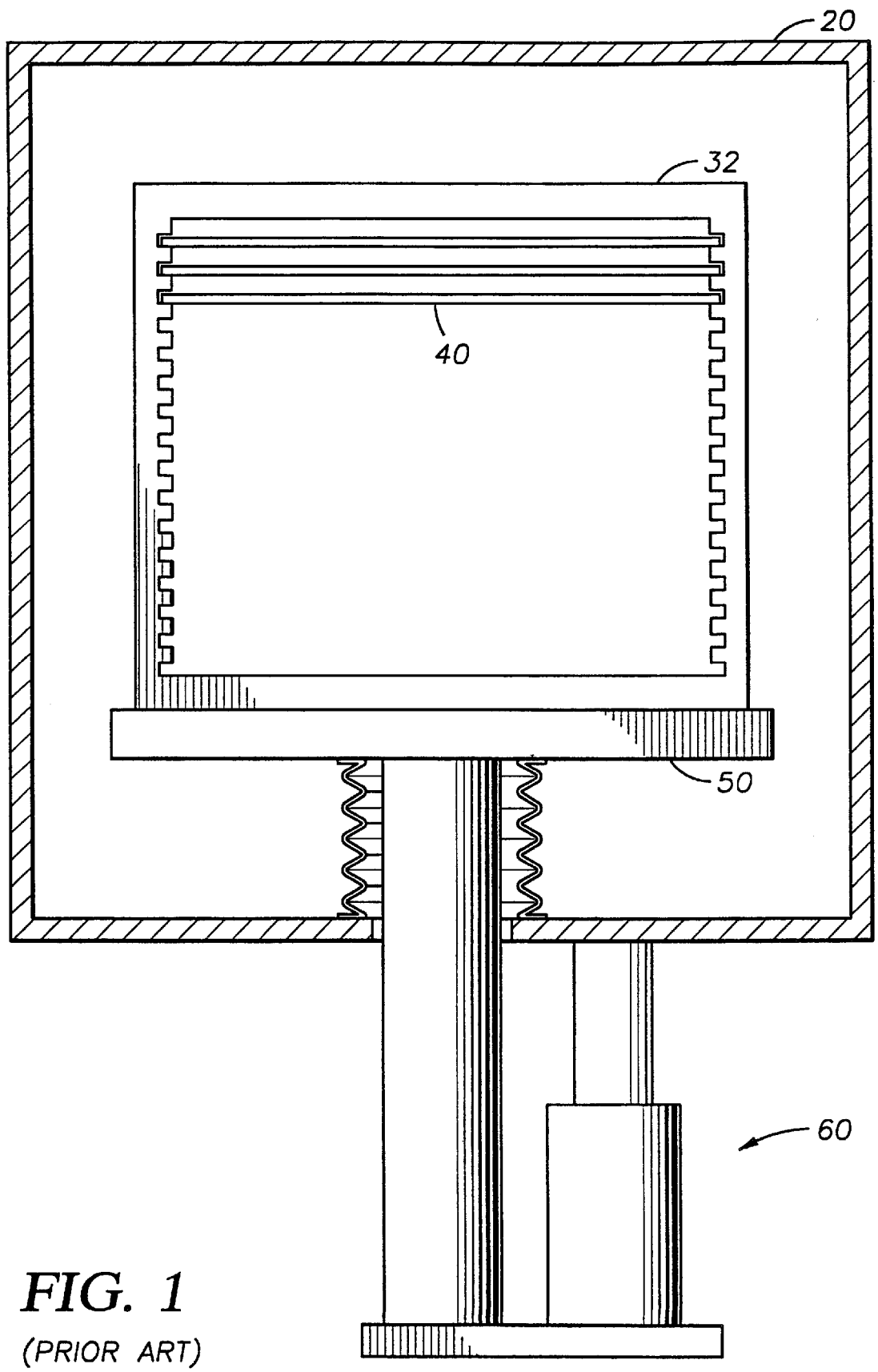
FIG. 1 is a schematic view of a prior art loadlock.
Figure 4:
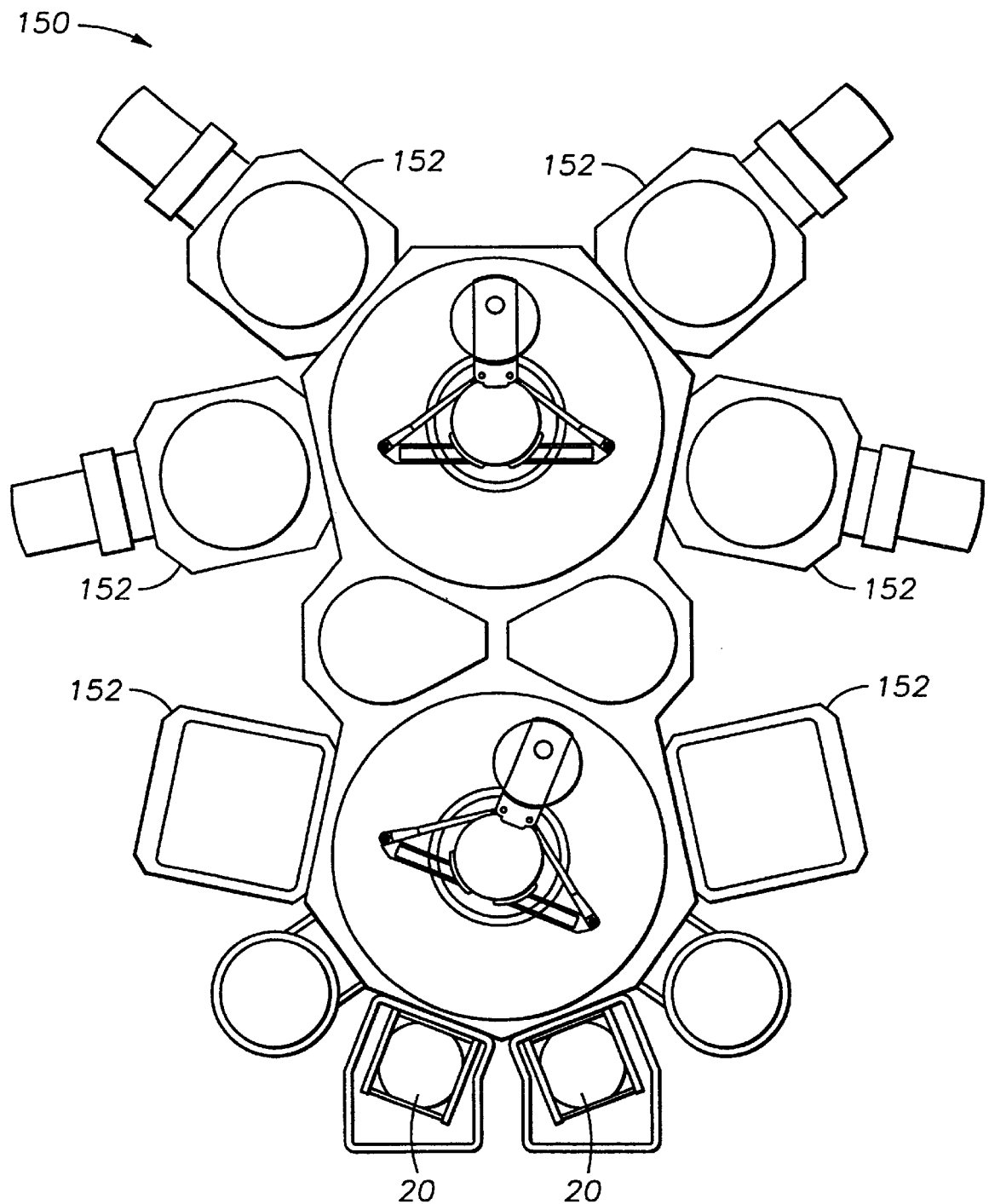
FIG. 4 is a top elevational view vacuum processing system.
Figure 5:
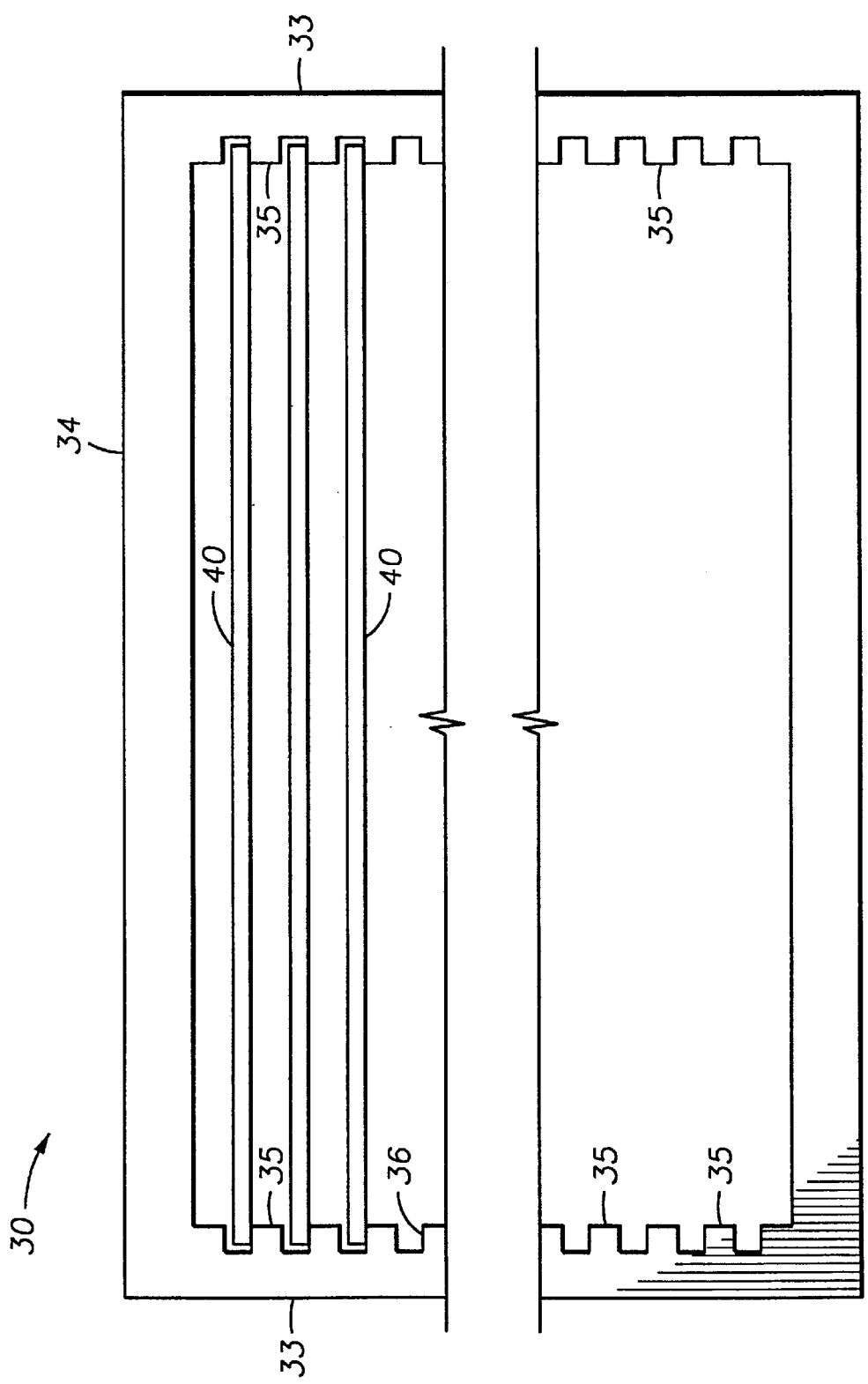
FIG. 5 is a side elevational view of the wafer cassette.

FIG. 4 shows a top elevational view of a vacuum processing system. The manufacture of semiconductor devices is typically carried out at the wafer level. The disk-like wafers 40 (as shown in FIGS. 1 and 5) of semiconductor material making up a large number of individual devices proceed as a whole through the manufacturing process before being separated into individual devices, such as microprocessors. The quest for greater throughput and cleaner manufacturing processes has led to greater automation of the manufacturing processes as well as the use of a vacuum processing environment. In this vacuum processing system 150 robots operating on a single horizontal plane move the individual wafers 40 through the manufacturing process from an entry port to one or more processing chambers 152 where a step of the overall process of forming an integrated circuit is performed on the wafer.

The wafers 40 are introduced into the vacuum processing system 150 at atmospheric pressure after which the system 150 is pumped down to the desired pressure. Accordingly, a number of wafers 40 are introduced into the system at one time to reduce the number of pumpdown cycles. This is typically accomplished by placing the wafers 40 in a wafer cassette 32 adapted to hold a plurality of horizontally oriented wafers 40 in vertically offset relation to one another. FIG. 1 shows a schematic view of a prior loadlock 20 having a wafer cassette 32 therein. Depending upon the construction of the loadlock 20 the wafer cassette 32 may or may not be removable from the loadlock 20. In the loadlocks 20 wherein the cassette 32 is removable, the wafers 40 are placed in the cassette 32 before the cassette 32 is inserted into the loadlock 20. In the other type of loadlock 20, the wafers 40 are individually inserted into the cassette 32 while it is in the loadlock 20. For convenience and clarity, the following description is primarily directed at the removable type of cassette 32, although the present invention is equally applicable to all types. In these systems, after the wafers 40 are placed in the cassette, the cassette 32 is then placed in a loadlock 20 and the system 150 is pumped down to the desired vacuum. Once placed in the system 150, however, the cassette 32 must be indexed to sequentially position each of the wafers 40 at the horizontal operating plane adjacent a slit opening so that the system robot can access each wafer 40 and move it through the system 150.

Figure 2:
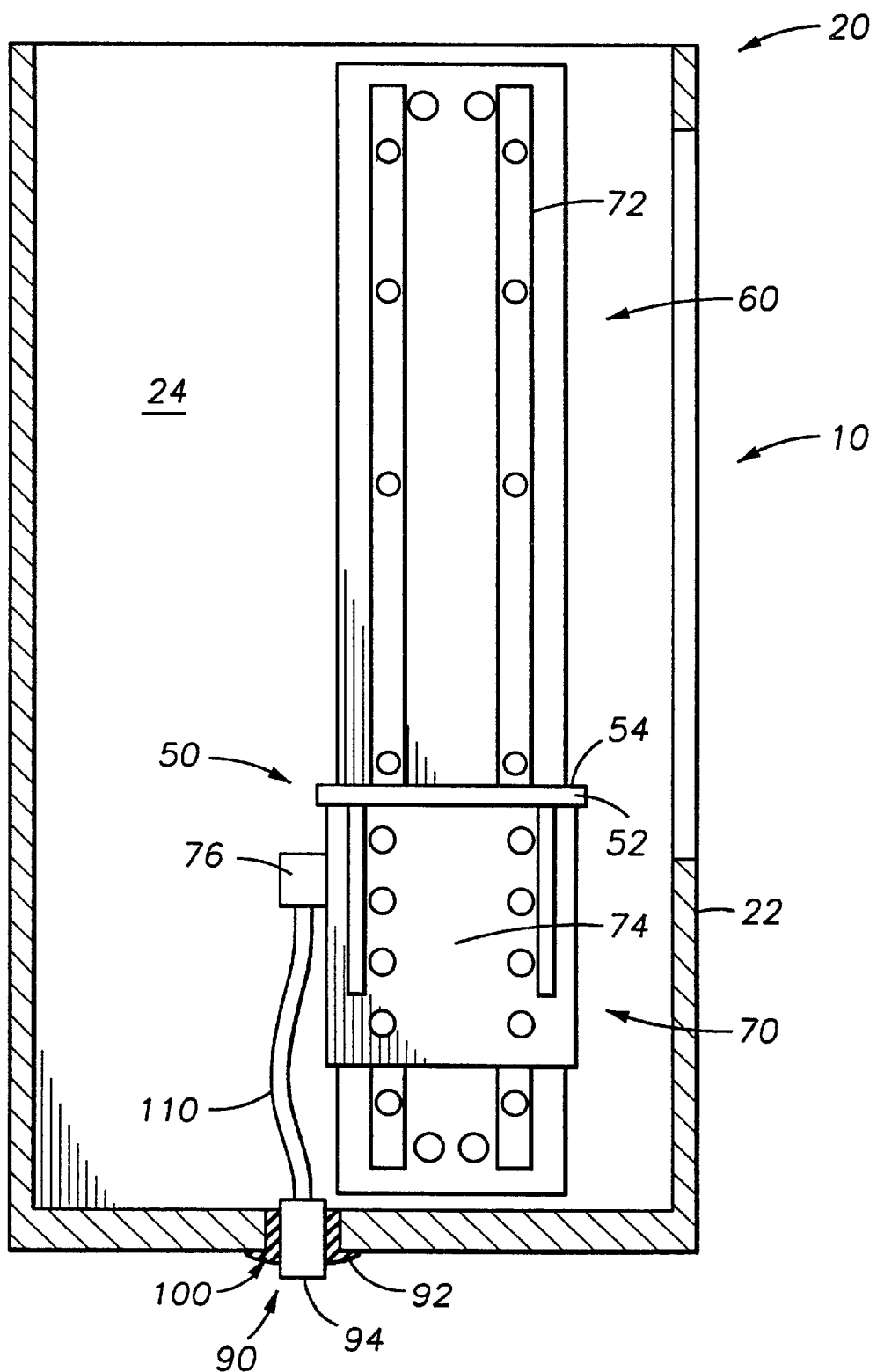
FIG. 2 is a partial cross sectional, front elevational view of the indexing apparatus.
Figure 3:
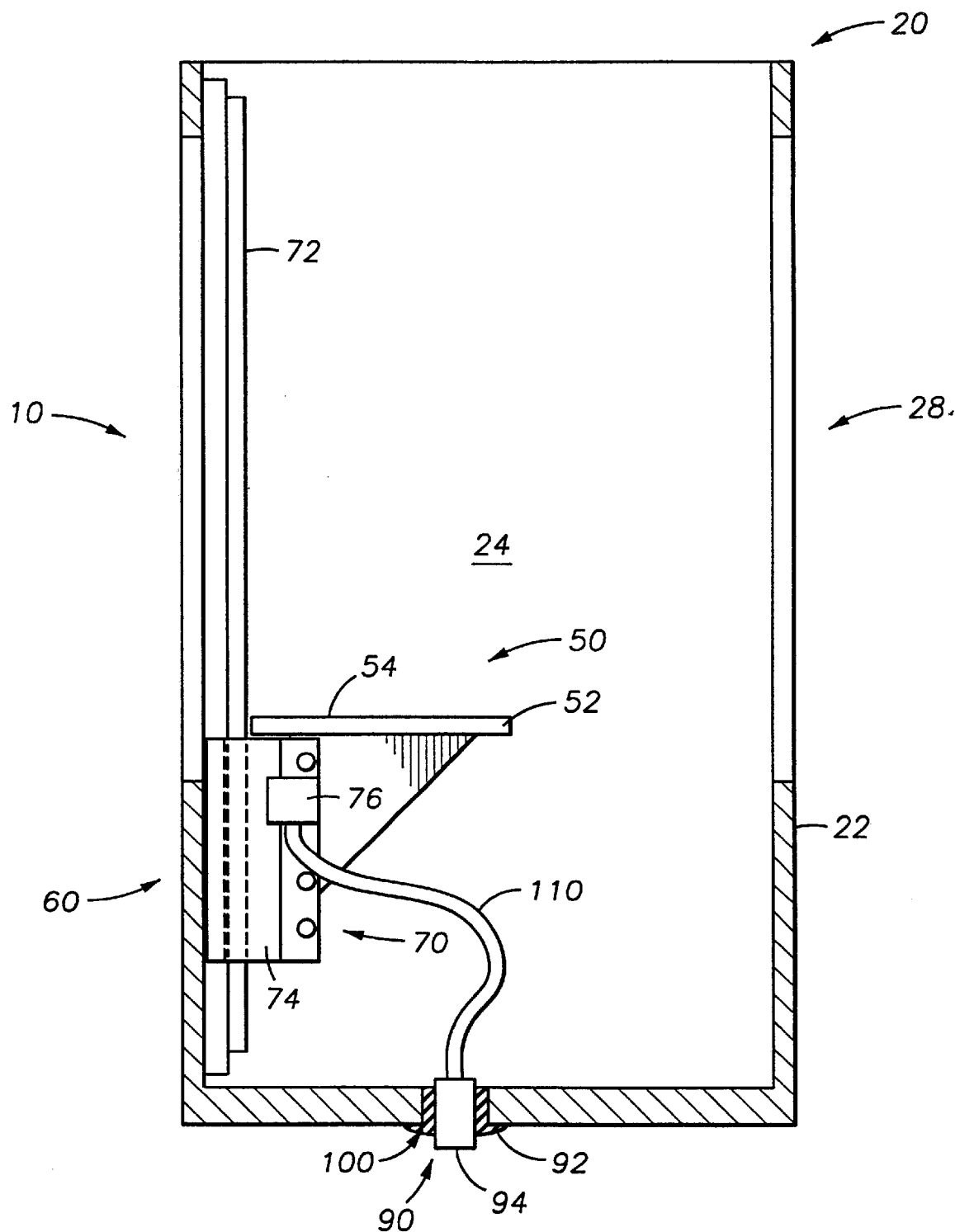
FIG. 3 is a partial cross sectional, side elevational view of the indexing apparatus.

The indexing of the cassette 32 is accomplished using an indexing apparatus, or apparatus for positioning an object at multiple positions within an enclosure, depicted in FIGS. 2 and 3 as 10. As shown in FIGS. 2 and 3, the indexing apparatus 10 generally comprises a moveable positioning member 50 attached to a motion actuator 60 both of which are positioned within an enclosure 20. Fundamentally, the improvement is the placement of the motion actuator 60 completely within the enclosure 20.

As used herein, motion actuator 60 refers generally to any type of machine or mechanism capable of actuating motion of the moveable positioning member 50. Thus, examples of possible motion actuators 60 may be used in the present invention include among others, screw and hydraulic offset mechanisms used in prior art devices as well as linear motors 70, the latter being the preferred motion actuators 60 of the present invention.

The enclosure 20 has a wall 22 that defines an interior 24 to the enclosure 20. Typically, a door 26 of the enclosure 20 provides selective opening and sealed closing of an opening 28 (as shown in FIG. 3) in the enclosure wall 22. The opening 28 is sufficiently large that objects 30 constructed for placement within the enclosure 20 will pass through the opening 28. For a loadlock, this means that the opening 28 is large enough so that a wafer cassette 32 may be positioned through the opening 28 and within the loadlock. In addition, the overall size of the interior 24 of the loadlock apparatus 20 is sufficiently large to accommodate the moveable positioning member 50, the motion actuator 60, and the wafer cassette 32 regardless of the vertical offset position of these components. Thus, the interior 24 must also accommodate the vertical displacement of the wafer cassette 32. However, to conserve space and energy in creating the vacuum, the interior 24 of the loadlock apparatus 20 is constructed to enclose the components leaving only a predefined clearance. Some applications may omit the door 26 from the opening 28 and, thus the enclosure 20, when the opening 28 is, for example, in fluid communication solely with other sealed enclosures. For instance, this example could apply in an intermediate component of a vacuum processing system 150, as shown in FIG. 4, which only communicates with other enclosures and passageways that are themselves sealed and under a vacuum.

As previously mentioned, a vacuum is created in the loadlock apparatus 20 once the wafer cassette 32 is placed therein. The wafer cassette 32 is placed in and removed from the loadlock apparatus 20 at atmospheric pressure. Accordingly, the loadlock apparatus 20 must have a gas-tight seal capable of maintaining a vacuum. It must also include at least one ventilation port 29 through which the air may be removed from and replaced in the loadlock apparatus 20 to alternately create the vacuum and return the interior 24 to atmospheric pressure. Consequently, the basic procedure for inserting the wafer cassette 32 into and removing it from the loadlock apparatus 20 involves (1) opening the enclosure door 26, (2) placing the cassette 32 within the loadlock apparatus 20 through the opening 28 and sealing the door 26, (3) evacuating the air from the interior 24 of the loadlock apparatus 20 to create a vacuum, and (4) when ready to remove the cassette 32, the loadlock apparatus 20 is vented to atmosphere and the door 26 is opened.

The object 30 may be any object that requires elevating within an enclosure, but in the case of a loadlock apparatus is a wafer cassette 32. FIG. 5 is a side elevational view of a wafer cassette 32. In other applications within the vacuum processing system 150, for example, the object 30 may comprise a single wafer 40 or a wafer support member such as a pedestal or heater. Typical wafer cassettes 32 are constructed to removably receive and hold a plurality of wafers 40 in horizontal orientation, vertically offset from one another. As mentioned, the wafer cassette 32 may or may not be removable from the loadlock 20. The wafer cassette 32 has a pair of vertically oriented, parallel sides 33 connected to one another at the top and bottom by horizontally oriented, parallel connecting members 34. Support members 35 attached to the inner surface of the sides 33 extend horizontally in equal spaced relation to one another to define grooves 36 therebetween. Each of the grooves 36 is sufficiently large to receive a wafer 40 and is adapted to support the wafer 40 vertically. At least one of the ends of the cassette 32 is left open to permit the wafers 40 to be placed in and removed from the grooves 36. Many other embodiments for the wafer cassette 32 are known. For example, in some cassettes 32 the side walls are replaced with corner posts that have arms extending therefrom toward the center of the cassette 32 to support the wafers 40.

While previous enclosures have motion actuators 60 (e.g., screw or hydraulic offset mechanisms) that extend through a wall 22 of the enclosure 20, the present invention eliminates the resulting vacuum to atmosphere interface by positioning the motion actuator 60 completely within the enclosure 20. The prior systems are especially prone to leaks due to the relative motion created at the interface. To create the required seal at the interface, the prior art systems had to resort to a collapsible bellows that surrounded the interface and connected the enclosure 20 to the moveable component of the motion actuator 60 located within the enclosure 20. The present invention eliminates the bellows seal, the relatively large interface, and any relative motion at any sealed interface of the enclosure 20 by fully enclosing the motion actuator 60 (e.g., linear motor 70 and screw or hydraulic by fully enclosing the offset mechanism) within the enclosure 20.

This may be accomplished by increasing the size of the enclosures 20 of the known systems to accommodate their motion actuators 60 (e.g., screw or hydraulic offset mechanisms). Preferably though, as shown in FIGS. 2 and 3 the motion actuator 60 is placed completely within the enclosure 20 without enlarging the size of the known enclosures 20. These known enclosures 20 presently accommodate the types of motion actuators 60 used in the prior systems, namely screw or hydraulic offset mechanisms. To accomplish this, the preferred embodiment replaces the motion actuators 60 of the prior systems with a linear motor 70 type of motion actuator 60. Using a linear motor 70 alleviates the need to enlarge the enclosure 20 because of their relatively compact construction. Additionally, the use of the linear motor 70 allows the elimination of the space below the enclosure 20 previously required by the motion actuators 60 of prior systems because the linear motor 70 does not extend below the enclosure 20.

Linear motors 70 operate on essentially the same principle as rotary induction motors. However, instead of a rotating magnetic field, the magnetic field sweeps across the flat motor face. The linear motor 70 has a stator 72 and a reaction plate 74. The stator 72 is typically a three phase winding in a laminated iron core. When the stator 70 is energized from an AC power source a traveling wave magnetic field is produced. The reaction plate 74 is the equivalent of a rotor in a rotary induction motor and comprises a sheet of conductive material often having a flat plate of backing material. The magnetic field produces a force that propels the reaction plate 74 linearly along the surface of the stator 72. Reversing two phases of the power supply reverses the direction of the magnetic wave and, thus, the reaction plate 74.

As a result of its design, the linear motor 70 is positioned at the location where the linear motion is required. The reaction plate 74 moves along the linear stator 72. Therefore, the stator 72 and reaction plate 74 are positioned within the enclosure 20 where the linear, vertical motion of the object is required. However, the linear motors 70 are relatively small which allows them, in a loadlock apparatus example, to fit within the interior 24 of existing loadlocks.

Other advantages known to those familiar with linear motors 70 include ease of use and control, fast response, and adjustable acceleration. They are mechanically simple having a bearing of air between the stator 72 and the reaction plate 74 and eliminate any need for lubrication or maintenance necessary in the prior systems. Additionally, linear motors 70 have extremely high accuracy and repeatability. Precise positioning of the wafer cassette 32 and the wafers 40 prevents any collision of the robot blade and the wafer 40 and ensures proper sequencing of the wafers 40.

In the preferred embodiment, the stator 72 is attached to a wall 22 of the enclosure 20 and extends vertically thereon. The stator 72 is elongated and typically comprises a pair of parallel rails having a length that is determined by the required travel distance of the object. The reaction plate 74 is attached to the stator 72 in such a manner that it is free to move relative thereto vertically along the stator 72. The position and movement of the reaction plate 74 relative to the stator 72 is determined by an external control signal.

The moveable positioning member 50 is attached to and moves with the reaction plate 74. The moveable positioning member 50 is adapted to support the object 30 when the object 30 is in the enclosure 20. Note that, in loadlock enclosures 20 wherein the cassette 32 is not removable, the cassette 32 may be fixedly attached to the moveable positioning member 50. To provide the required support, the preferred embodiment of the moveable positioning member 50 has a platform 52 with a substantially flat upper surface 54. The upper surface 54 lies in a horizontal plane so that it may receive the bottom of a flat object 30 and effectively support the object 30. Consequently, for a loadlock apparatus 20, the moveable positioning member 50 is constructed with a platform 52 suitable for receiving and supporting a wafer cassette 32 on its upper surface 54 for the removable type of cassette 32.

It then follows that the height of the loadlock apparatus 20 must be at least equal to the height of the wafer cassette 32 plus the required travel distance of the cassette 32 (which is typically approximately equal to the height of the cassette), plus the required clearance for the moveable positioning member 50 and a small clearance below the moveable positioning member 50 for the linear motor 70 and above the top of the cassette 32 when it is in its uppermost position to avoid contact with the enclosure 20. This height calculation assumes that the platform 52 does not extend substantially above the reaction plate 74. An alternate embodiment, that would reduce the space savings of the use of a linear motor 70, could include an extension that positions the platform 52 substantially above the reaction plate 74. In this way, the linear motor 70 could be maintained below the platform 52 which would allow access to the object 30 from any direction.

The power and control signal for the linear motor 70 are received at a communication junction 76 attached to and in communication with the reaction plate 74. A flexible communication line 110 transmits the power and control signal from an insulated conductor 90 to the communication junction 76. The insulated conductor 90 extends through the wall 22 of the enclosure 20. A layer of insulating material 92 insulates the conducting material 94 of the insulated conductor 90 from the enclosure 20. The insulated conductor 90 extends through a wall opening 23 in the enclosure wall 22 and, thereby, creates a stationary vacuum to atmosphere interface 100. This interface 100 is sealed to facilitate creation and maintenance of a vacuum within the enclosure 20. The insulated conductor 90 communicates with a power supply that supplies the power and a control mechanism that supplies the control signal for the linear motor 70.

To avoid particle generation, the flexible communication line 110 is adapted to avoid contact with the enclosure 20. The preferred embodiment of the flexible communication line 110, illustrated in FIG. 1, has a length that is just sufficient that it can maintain contact between the insulated conductor 90 and the communication junction 76 when the reaction plate 74 is in its uppermost position. The flexible communication line 110 is relatively stiff and predisposed to bend in a particular direction so that, as the moveable positioning member 50 is lowered, the communication line 110 curves to a predetermined shape and position within the enclosure 20. Therefore, rather than merely randomly moving within the enclosure 20, the position of the communication line 110 may be predetermined and set to avoid contact with the enclosure 20.

Operationally, when placed in the enclosure 20, the wafer cassette 32 rests on the upper surface 54 of the platform 52. The linear motor 70 responding to a control signal, which is preferably predefined and preprogrammed on a system controller, moves the platform 52 between multiple positions. Each such position is defined by the placement of each of the wafers 40 at the horizontal operating plane, the plane at which the vacuum processing system 150 processes the wafers 40. The control signal directs the linear motor 70 to move the wafer cassette 32 sequentially to each of the multiple positions so that the robots within the vacuum processing system 150 can access each of the wafers 40 for processing.

While the foregoing is directed to the preferred embodiment of the present invention, other and further embodiments of the invention may be devised without departing from the basic scope thereof, and the scope thereof is determined by the claims which follow.

What is claimed is:

1. An apparatus for positioning an object at multiple positions within an enclosure comprising:
    a moveable positioning member contained within said enclosure; and
    a linear motor contained completely within said enclosure and connected to said movable positioning member; wherein:
        said linear motor comprises a stator and a reaction plate;
        said stator is coupled to said enclosure;
        said reaction plate is moveable relative to said stator; and
        said moveable positioning member is coupled to said reaction plate.
2. The apparatus of claim 1 wherein a wafer cassette contacts the moveable positioning member.
3. The apparatus of claim 2 wherein said wafer cassette comprises a plurality of support members to hold a plurality of wafers in horizontal orientation, vertically offset from one another.
4. The apparatus of claim 1 wherein said enclosure is capable of maintaining a vacuum.
5. The apparatus of claim 1 wherein said enclosure is a loadlock apparatus.
6. The apparatus of claim 1 wherein said moveable positioning member comprises:
    a platform having an object receiving surface thereon, and the object receiving surface is substantially flat and lies in a horizontal plane.
7. The apparatus of claim 1, wherein:
    said enclosure comprises an interior wall; and
    an insulated conductor extends through said wall defining a sealed interface therebetween.
8. The apparatus of claim 7 further comprising:
    a flexible communication line providing communication between said insulated conductor and said motion actuator; and
    said flexible connection line having a predisposed shape at a position offset from said enclosure.
9. A chamber apparatus comprising:
    an enclosure having a wall defining an interior;
    an insulated conductor extending through said wall defining an interface;
    a linear motor completely enclosed within said enclosure; and
    a moveable positioning member coupled to the linear motor.
10. The apparatus of claim 9 further comprising:
    said interface between said wall and said insulated conductor forming a seal;
    a flexible communication line providing communication between said insulated conductor and said linear motor; and
    said flexible connection line having a predisposed shape at a position offset from said enclosure.
11. An apparatus for positioning an object at multiple positions within an enclosure comprising:
    a moveable positioning member contained within said enclosure; and
    a motion actuator contained completely within said enclosure and connected to said movable positioning member;
    wherein said enclosure comprises an interior wall, and an insulated conductor extends through said wall defining a sealed interface therebetween.
12. The apparatus of claim 11 further comprising:
    a flexible communication line providing communication between said insulated conductor and said motion actuator; and
    said flexible connection line having a predisposed shape at a position offset from said enclosure.
13. The apparatus of claim 11 wherein a wafer cassette contacts the moveable positioning member.
14. The apparatus of claim 13 wherein said wafer cassette comprises a plurality of support members to hold a plurality of wafers in horizontal orientation, vertically offset from one another.
15. The apparatus of claim 11 wherein said enclosure is capable of maintaining a vacuum.
16. The apparatus of claim 11 wherein said enclosure is a loadlock apparatus.
17. The apparatus of claim 11 wherein said moveable positioning member comprises:
    a platform having an object receiving surface thereon, and the object receiving surface is substantially flat and lies in a horizontal plane.
18. The apparatus of claim 11 wherein said motion actuator is a linear motor.

* * * * *